(12) United States Patent
Sekiguchi et al.

(10) Patent No.: US 7,993,974 B2
(45) Date of Patent: Aug. 9, 2011

(54) METHOD FOR MANUFACTURING A SEMICONDUCTOR DEVICE

(75) Inventors: Masahiro Sekiguchi, Yokohama (JP); Eiji Takano, Yokohama (JP); Tatsuhiko Shirakawa, Mitaka (JP); Kenichiro Hagiwara, Yokohama (JP); Masayuki Dohi, Yokohama (JP); Susumu Harada, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 252 days.

(21) Appl. No.: 12/236,567

(22) Filed: Sep. 24, 2008

(65) Prior Publication Data
US 2009/0194865 A1 Aug. 6, 2009

(30) Foreign Application Priority Data

Sep. 27, 2007 (JP) ................. P2007-251655

(51) Int. Cl.
*H01L 21/30* (2006.01)
(52) U.S. Cl. . 438/113; 438/459; 438/464; 257/E21.214; 257/E21.599
(58) Field of Classification Search ........... 438/113, 438/455, 459, 464; 257/E21.214, E21.599
See application file for complete search history.

(56) References Cited

U.S. PATENT DOCUMENTS

| 5,869,386 | A | * | 2/1999 | Hamajima et al. | 438/455 |
| 6,375,738 | B1 | * | 4/2002 | Sato | 117/89 |
| 7,180,149 | B2 | | 2/2007 | Yamamoto et al. | |
| 7,562,952 | B2 | * | 7/2009 | Yamamoto | 347/7 |
| 2004/0061200 | A1 | | 4/2004 | Iwamatsu et al. | |
| 2004/0151917 | A1 | | 8/2004 | Chen et al. | |
| 2004/0268286 | A1 | * | 12/2004 | New et al. | 716/14 |
| 2006/0006423 | A1 | | 1/2006 | Iwamatsu et al. | |
| 2006/0244148 | A1 | * | 11/2006 | Lu | 257/772 |
| 2008/0032486 | A1 | | 2/2008 | Iwamatsu et al. | |
| 2008/0032487 | A1 | * | 2/2008 | Iwamatsu et al. | 438/459 |

FOREIGN PATENT DOCUMENTS

| EP | 1662564 | 5/2006 |
| JP | 10-281807 | 10/1998 |
| JP | 2003046071 | 2/2003 |
| JP | 2004119943 | 4/2004 |
| JP | 2005-183689 | 7/2005 |
| WO | 2005/022631 | 3/2005 |

* cited by examiner

*Primary Examiner* — Tuan N. Quach
(74) *Attorney, Agent, or Firm* — Turocy & Watson, LLP (57) ABSTRACT

A method for manufacturing a semiconductor device, includes: preparing a semiconductor substrate with a first notch; preparing a supporting substrate with a second notch; laminating the semiconductor substrate with the supporting substrate so that the first notch can be matched with the second notch; and processing a second main surface of the semiconductor substrate opposite to a first main surface thereof facing to the supporting substrate to reduce a thickness of the semiconductor substrate to a predetermined thickness.

10 Claims, 5 Drawing Sheets

METHOD FOR MANUFACTURING A SEMICONDUCTOR DEVICE

CROSS-REFERENCE TO RELATED APPLICATIONS

This application is based upon and claims the benefit of priority from the prior Japanese Patent Application No. 2007-251655 filed on Sep. 27, 2007; the entire contents which are incorporated herein by reference.

BACKGROUND OF THE INVENTION

1. Field of the Invention

The present invention relates to a method for manufacturing a semiconductor device, a method for detecting a semiconductor substrate and a semiconductor chip package.

2. Description of the Related Art

A semiconductor device such as a CCD or a CMOS image sensor using semiconductor integration circuit technique is widely available for a digital camera or a cellular phone with camera function. In order to realize the downsizing and lightening in weight of the parts to be mounted on the semiconductor device, it is proposed that the sensor chip (semiconductor element) is constructed as a CSP (Chip Size Package). With a FBAR (Film Bulk Acoustic Resonator) or a MEMS (Micro Electro Mechanical Systems), it is also proposed that the sensor chip (semiconductor element) is constructed as a CSP.

With the fabrication of the sensor chip as the CSP, through holes are formed so as to connect the main surface and the rear surface of the semiconductor element (semiconductor substrate) so that the integrated circuits formed on the main surface of the semiconductor substrate are electrically connected with the external connection terminals formed on the rear surface of the semiconductor substrate by the conductive layers (penetrating wirings) formed in the through holes. Moreover, a protective member is provided so as to protect the sensor formed on the main surface of the semiconductor substrate against dirt, dust and external disturbance (References 1 and 2). The protective member is provided above the sensor so that the surface of the protective member becomes parallel to the main surface of the semiconductor substrate.

When the sensor functions as a light receiving sensor, a light transmission protective member such as glass substrate may be employed as the protective member. When the sensor does not function as the light receiving sensor, the light transmission protective member such as glass substrate is employed in view of the position detection of the semiconductor substrate. The light transmission protective member functions as a supporting substrate to mechanically reinforce the semiconductor substrate. In this point of view, the glass substrate is laminated with the glass substrate shaped in wafer to realize the thickening process of the semiconductor substrate (Reference 2).

In the case of the formation of the penetrating wirings at the semiconductor substrate, the through holes are formed at the semiconductor substrate laminated with the supporting substrate so that the inner walls of the through holes and the rear surface of the semiconductor substrate are covered with respective insulating films. This subsequent process is carried out for the semiconductor substrate shaped in wafer. Therefore, after the wafer process is finished, the semiconductor substrate is cut off into sensor chips (semiconductor devices) with the glass substrate. When the glass substrate is employed only as the supporting substrate, the semiconductor substrate is cut off into sensor chips (semiconductor devices) after the glass substrate is peeled off from the semiconductor substrate.

By the way, with the position detection of a semiconductor substrate, a notch is formed at the periphery of the semiconductor substrate and a light is irradiated at the periphery of the semiconductor substrate so as to detect the light passed through the notch, and thus, detect the position of the semiconductor substrate. When the light transmission member such as the glass substrate is employed as the supporting substrate, the position detection of the semiconductor substrate can be conducted using the notch at the initial stage.

However, since the supporting substrate is laminated with the semiconductor substrate so as to cover the semiconductor substrate, if some insulating films and some conductive layers are formed on the semiconductor substrate, some debris originated from the films are stuck at the notch. Therefore, the light for detecting the position of the semiconductor substrate can not be passed through the notch due to the debris stuck on the notch so that the position of the semiconductor substrate can not be detected. On the other hand, the periphery or the notch of the semiconductor substrate are detected by means of image processing using an optical system such as a camera, but the image processing system is expensive so that the device cost and thus, the manufacturing cost of the semiconductor device results in being increased.

[Reference 1] JP-A 10-281807 (KOKAI)
[Reference 2] WO 2005/022631 (KOKAI)

BRIEF SUMMARY OF THE INENTION

An aspect of the present invention relates to a method for manufacturing a semiconductor device, including: preparing a semiconductor substrate with a first notch; preparing a supporting substrate with a second notch; laminating the semiconductor substrate with the supporting substrate so that the first notch can be matched with the second notch; and processing a second main surface of the semiconductor substrate opposite to a first main surface thereof facing to the supporting substrate to reduce a thickness of the semiconductor substrate to a predetermined thickness.

Another aspect of the present invention relates to a method for detecting a semiconductor substrate, including: preparing a semiconductor substrate with a first notch; preparing a supporting substrate with a second notch; laminating the semiconductor substrate with the supporting substrate so that the first notch can be matched with the second notch; and detecting the first notch so as to detect a position of the semiconductor substrate.

Still another aspect of the present invention relates to a semiconductor chip package, including: a semiconductor substrate with a first notch; a supporting substrate with a second notch laminated with the semiconductor substrate so that the first notch can be matched with the second notch; an active element region formed on the first main surface of the semiconductor substrate; a first wiring layer formed on the first main surface of the semiconductor substrate so as to be electrically connected with the active element region; a through hole formed at the semiconductor substrate so as to connect the first main surface and the second main surface; a second wiring layer formed on the second main surface of the semiconductor substrate so as to be electrically connected with the first wiring layer via a conductive layer formed in a through hole formed at the semiconductor substrate so as to connect the first main surface and the second main surface; a protective layer formed so as to cover the second main surface of the semiconductor substrate; and an external connection terminal formed in an opening formed so as to expose the second wiring layer to electrically connect the second wiring layer.

DETAILED DESCRIPTION OF THE INVENTION

Then, some embodiments will be described with reference to the drawings. FIGS. 1 to 6 relate to the manufacturing process of a semiconductor device according to a first embodiment. In this embodiment, the manufacturing process of a semiconductor device with a light receiving unit (e.g., CCD imaging element or a CMOS imaging element) having a light receiving element such as a photodiode will be described. First of all, a semiconductor substrate 1 and a supporting substrate 2 are prepared. The semiconductor substrate 1 is supplied as a semiconductor wafer. The supporting substrate 2 is also supplied as a wafer-shaped substrate.

Figure 1:
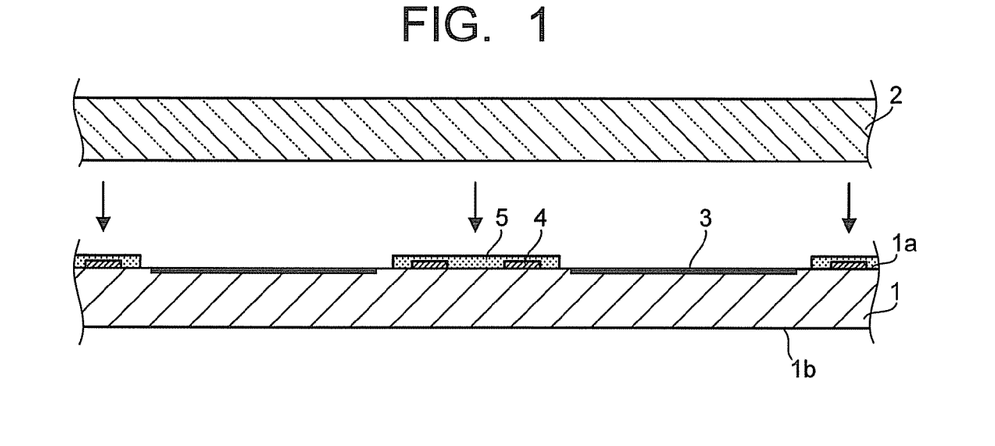
FIG. 1 is a cross sectional view showing the preparation of a semiconductor substrate and a supporting substrate in a method for manufacturing a semiconductor device according to a first embodiment.

The semiconductor substrate 1 is made of, e.g., silicon (Si). Then, an active element region with a light receiving unit 3 is defined on a first main surface 1a of the semiconductor substrate 1. The light receiving unit 3 includes a light receiving element such as a photodiode which is configured so as to receive a light or an energy beam irradiated onto the first main surface 1a and collect the received light or energy beam therein. Moreover, a first wiring layer 4 is provided on the first main surface 1a of the semiconductor substrate 1 so as to be electrically connected with the light receiving unit 3 within the active element region, other elements and wirings. The light receiving unit 3 and the first wiring layer 4 are formed at the corresponding device formation regions of the semiconductor substrate (semiconductor wafer). The device formation regions constitute an image sensor such as CCD image sensor or a CMOS image sensor.

The supporting substrate 2 is made of a light transmission member such as glass substrate. In this embodiment, the supporting member 2 is employed as a light transmission protective member for the light receiving unit 3 formed on the first main surface 1a of the semiconductor substrate 1. Concretely, the light receiving member is made of borosilicate glass, quartz glass or soda-lime glass, for example. The size of the supporting substrate 2 is set almost equal to or slightly larger than the size of the semiconductor substrate 1. The supporting substrate 2 is disposed above the first main surface 1a of the semiconductor substrate 1 on which the light receiving unit 3 and the like are formed.

Figure 2:
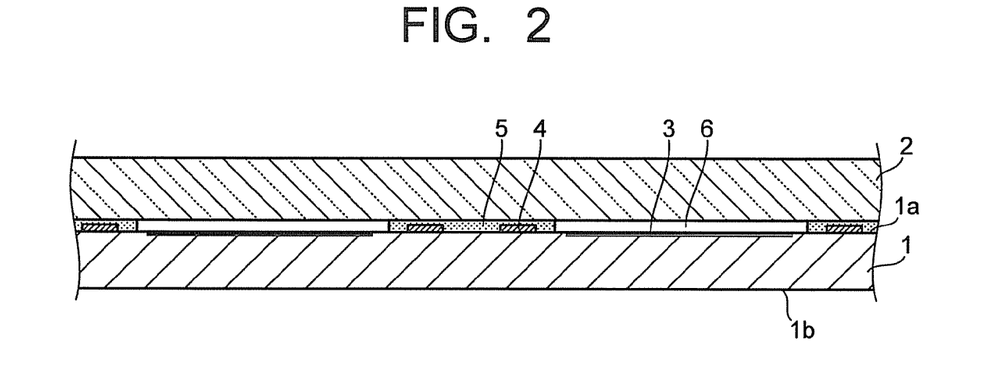
FIG. 2 is a cross sectional view showing the lamination of the semiconductor substrate and the supporting substrate in the manufacturing method according to the first embodiment.
Figure 5:
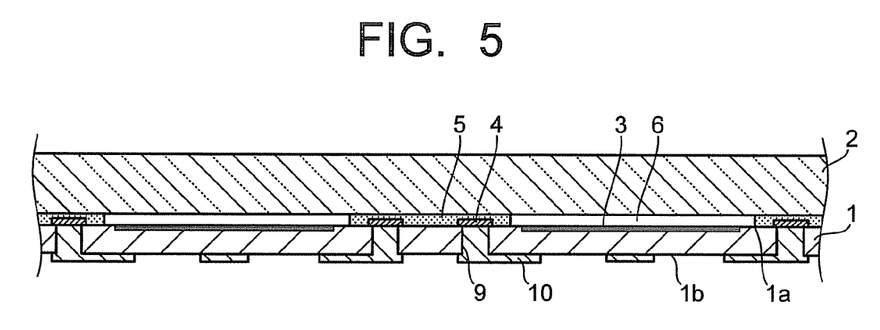
FIG. 5 is a cross sectional view showing the formation of films in the manufacturing method according to the first embodiment.

Then, an adhesive layer 5 is coated at the periphery of the semiconductor substrate 1 except the light receiving unit 3 of the first main surface 1a of the semiconductor substrate 1 so that the semiconductor substrate 1 is laminated with the supporting substrate 2 via the adhesive layer 5, as shown in FIG. 5. The adhesive layer 5 may be made of epoxy resin, polyimide resin, acrylic resin, silicone resin or the like. The adhesive layer 5 may be a photosensitivity adhesive or a non-photosensitivity adhesive. The adhesive layer 5 maybe coated by means of laminating method or roll-coating method under vacuum condition. The semiconductor substrate 1 is laminated with the supporting substrate 2 via the adhesive layer 5 by means of thermal pressing (vacuum thermal pressing). A cavity 6 is formed between the semiconductor substrate 1 and the supporting substrate 2 via the adhesive layer 5. The size and position of the cavity 6 depends on the position and thickness of the adhesive layer 5. In the formation of the cavity 6, dams may be formed and the adhesive layer 5 may be formed on the dams.

Figure 7:
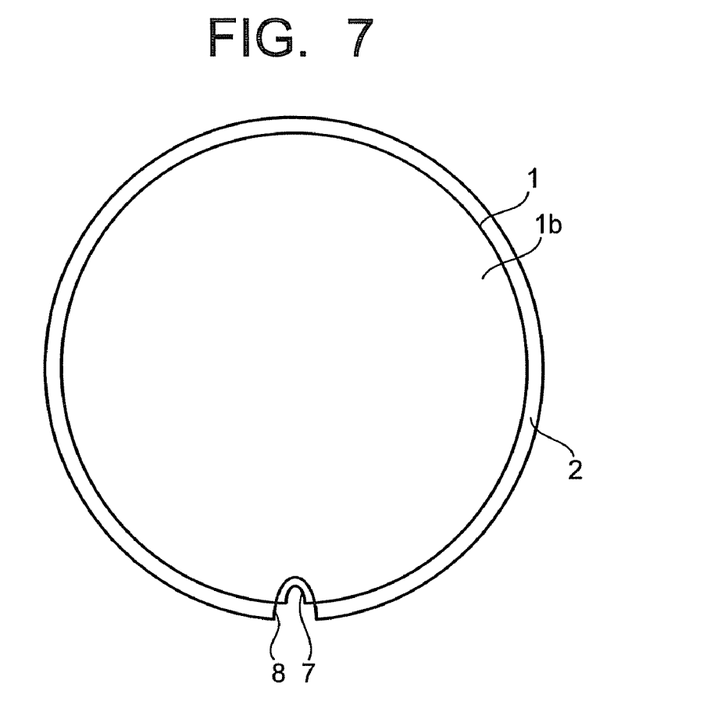
FIG. 7 is a plan view showing the state where the semiconductor substrate and the supporting substrate are laminated using a first notch and a second notch.
Figure 8:
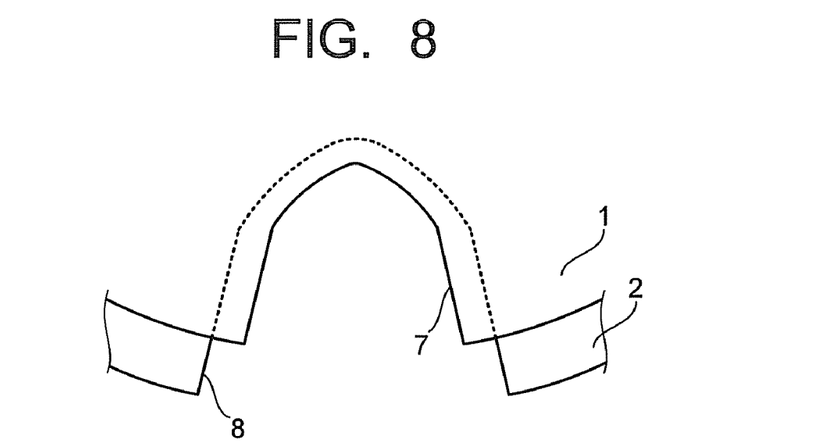
FIG. 8 is a plan view enlargedly showing a part of the laminated structure shown in FIG. 7.

In the lamination between the semiconductor substrate 1 (semiconductor wafer) and the supporting substrate 2 made of the wafer-shape glass substrate, notches 7 and 8 are formed at the semiconductor substrate 1 and the supporting substrate 2 in advance, respectively, as shown in FIGS. 7 and 8. Namely, the first notch 7 is formed at the periphery of the semiconductor substrate (semiconductor wafer) 1 and the second notch 8 is formed at the periphery of the supporting substrate 2. The first notch 7 is a notch for position determination and formed in minute wedge shape. The second notch 8 is set larger in size than the first notch 7, as shown in FIG. 8. The semiconductor substrate 1 is laminated with the supporting substrate 2 so that the first notch 7 is matched with the second notch 8.

Since the size of the second notch 8 is larger than the size of the first notch 7, the edges of the second notch 8 are located outside from the edges of the first notch 7 when the first notch 7 is matched with the second notch 8. Therefore, since the first notch 7, formed at the periphery of the semiconductor substrate 1, is not shielded by the supporting substrate 2, the first notch 7 can function as the inherent notch. In other words, when the semiconductor substrate 1 is laminated with the supporting substrate 2, the first notch 7 of the semiconductor substrate 1 can be directly detected by a light so that the accuracy of the position detection of the semiconductor substrate 1 can be enhanced and the position detection of the semiconductor substrate 1 can be conducted after one or some film forming processes.

The size of the second notch 8 may be set equal to the size of the first notch 7. In this case, the edges of the first notch 7 may be partially shielded by the second notch 8 due to the poor accuracy of the matching between the first notch 7 and the second notch 8 when the first notch 7 is matched with the second notch 8. In this point of view, it is desired that the size of the second notch 8 is set larger than the size of the first notch 7. Preferably, the second notch 8 is formed such that the edges of the second notch 8 are receded from the edges of the first notch 7 by a distance of 0.3 mm or more. According to the first notch 7 and the second notch 8 satisfying the above-described requirement, the position of the semiconductor substrate 1 can be detected even through the supporting substrate 2 is not made of the light transmission member.

Figure 3:
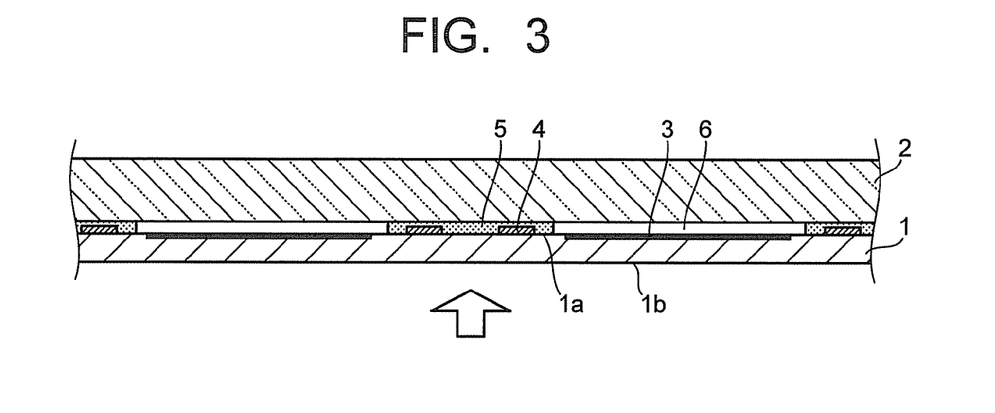
FIG. 3 is a cross sectional view showing the processing of a semiconductor substrate and a supporting substrate in the manufacturing method according to the first embodiment.

Then, the semiconductor substrate 1 is thinned as shown in FIG. 3 after the semiconductor substrate 1 is laminated with the supporting substrate 2 so that the first notch 7 is matched with the second notch 8. Namely, the second main surface 1*b* of the semiconductor substrate 1 opposite to the first main surface 1*a* thereof facing to the supporting substrate 2 is processed by means of mechanical grinding, chemical mechanical polishing (CMP), wet etching and/or dry etching to reduce the thickness of the semiconductor substrate 1 to a predetermined thickness. Therefore, the semiconductor substrate 1 can be thinned so that the final thickness of the semiconductor substrate 1 can be set within a range of 50 to 150 μm, for example, depending on the intended semiconductor device.

Figure 4:
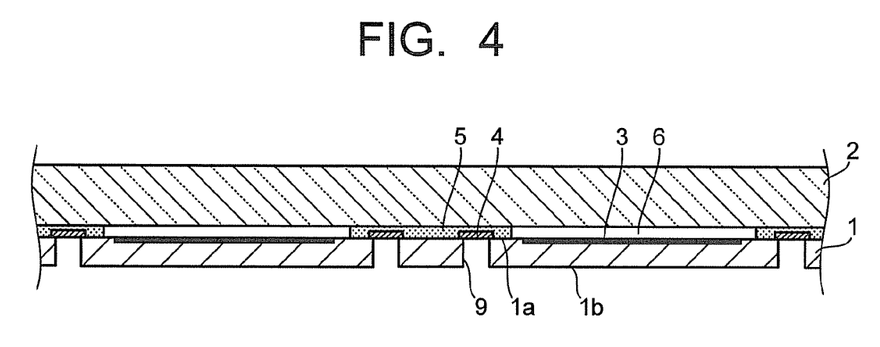
FIG. 4 is a cross sectional view showing the formation of through holes in the manufacturing method according to the first embodiment.

Then, as shown in FIG. 4, through holes 9 are formed at the semiconductor substrate 1 from the second main surface 1*b* to the first main surface 1*a* so as to expose the first wiring layer 4. The through holes 9 are formed by means of plasma etching or the like using a predetermined mask (not shown) arranged on the second main surface 1*b* of the semiconductor substrate 1. The through holes 9 may be formed by means of laser etching not using a mask.

Then, as shown in FIG. 5, second wiring layers 10 are formed on the second main surface 1*b* of the semiconductor substrate 1 so as to embed the inner walls of the through holes 9. The second wiring layers 10 constitute penetrating wiring layers. Not shown, insulating films are formed on the inner walls of the through holes 9 and on the second main surface 1*b* before the second wiring layers 10 are formed. The second wiring layers 10 are formed at the holes formed in the insulating films formed in the through holes 9 so as to electrically connect the first wiring layer 4 and the second wiring layer 10. The second wiring layer (penetrating wiring layers) 10 may be made of high resistance metallic material (Ti, TiN, TiW, Ni, Cr, TaN, COWP) or low resistance metallic material (Al, Al—Cu, Al—Si═Cu, Cu, Au, Ag, solder). The second wiring layer may be constructed as a single layered structure or a multilayered structure.

The second wiring layers 10 are formed by depositing conductive films into the through holes 9 and on the second main surface 2*b* by means of sputtering, CVD, vacuum deposition, plating, coating or the like. Alternatively, the conductive films are formed over the second main surface 1*b* of the semiconductor substrate 1 so as to embed the through holes 9. The conductive films are etched by using a predetermined patterned mask to form the second wiring layers 10. The insulating films, which are located between the second main surface 1*b* of the semiconductor substrate 1 and the conductive films, are patterned in the same manner as the second wiring layers. Herein, the film-forming step in this embodiment includes the formation step of at least one of the insulating films and the conductive films on the second main surface 1*b* of the semiconductor substrate 1.

During or after the film-forming step, since the first notch 7 formed at the periphery of the semiconductor substrate 1 is not shielded by the debris deposited on the supporting substrate 2 and originated from the formation of the insulating films and the conductive films, the position of the first notch 7 can be directly detected by a light. The position detection of the semiconductor substrate 1 can be conducted using the first notch 7 as follows. First of all, a light is irradiated onto the periphery of the semiconductor substrate 1 from a light source so that a portion of the light passing through the first notch 7 is detected at a light receiving sensor. After the position detection of the semiconductor substrate 1 is conducted on the detection at the sensor, the semiconductor substrate 1 is aligned using the first notch as a position-determining mark. In this way, the first notch 7 can be utilized effectively for the alignment of the semiconductor substrate 1.

Figure 6:
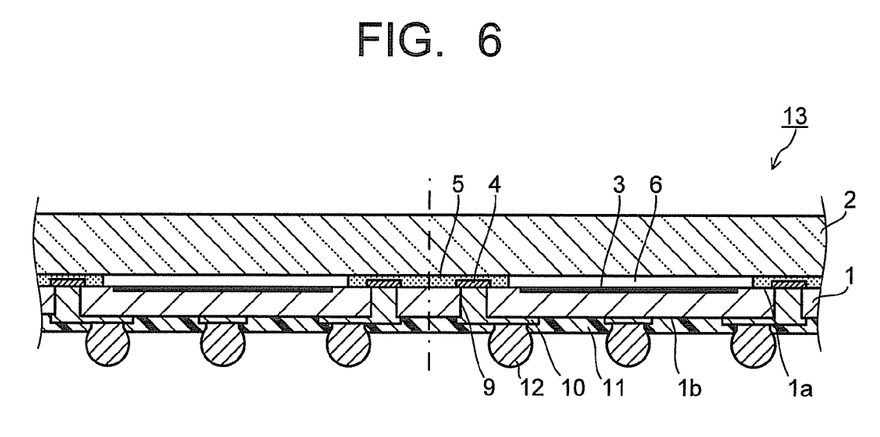
FIG. 6 is a cross sectional view showing the formation of a protective film and external connection terminals and the cutting process of the semiconductor substrate and the supporting substrate in the manufacturing method according to the first embodiment.

Then, as shown in FIG. 6, a protective layer 11 is formed so as to cover the second main surface 1*b* of the semiconductor substrate 1 and some openings for the formation of terminals are formed at the protective layer 11. Then, external connection terminals 12 are formed so as to embed the openings and electrically connected with the second wiring layers 12. The protective layer 11 may be made of polyimide, epoxy, solder resist or the like, and the terminals 12 may be made of solder material. The formation of the openings for the protective layer 11 and the formation of the external connection terminals 12 are conducted on the result of the position detection of the semiconductor substrate 1 using the first notch 7. After the subsequent steps (wafer process) are finished, the semiconductor substrate 1 is cut out into the pieces with the supporting substrate 2. Each piece constitutes the semiconductor device 13.

In the manufacturing process of the semiconductor device 13 according to the first embodiment, since the position of the first notch 7 of the semiconductor substrate 1 can be directly detected even though the semiconductor substrate 1 is laminated with the supporting substrate 2, the accuracy of the position detection of the semiconductor substrate 1 can be enhanced. Moreover, since the position of the notch 7 of the semiconductor substrate 1 can be detected after the film-forming process is conducted, the wafer process including the film-forming process and the etching process can be conducted effectively and efficiently.

Figure 9:
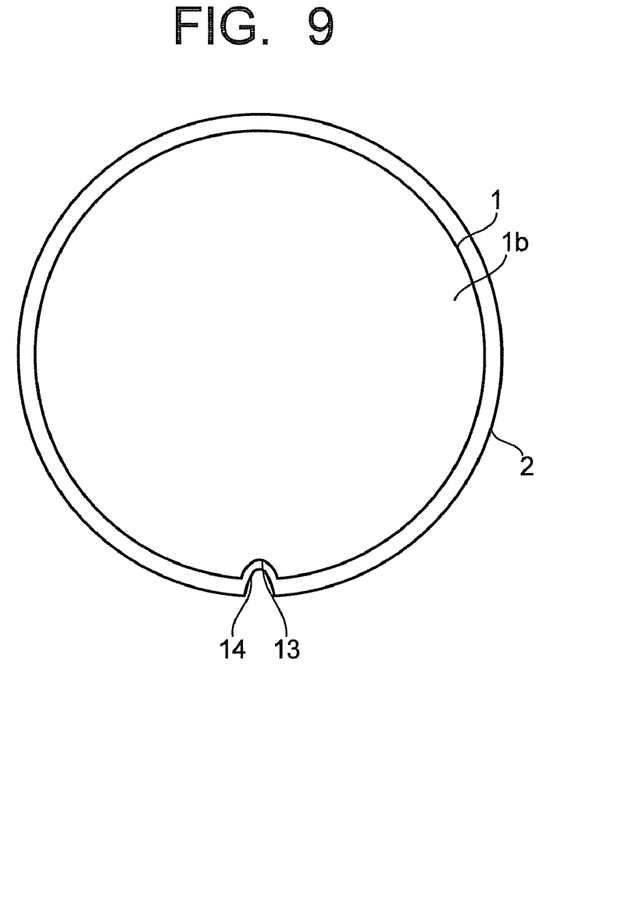
FIG. 9 is a plan view showing the state where the semiconductor substrate and the supporting substrate are laminated using another first notch and another second notch.
Figure 10:
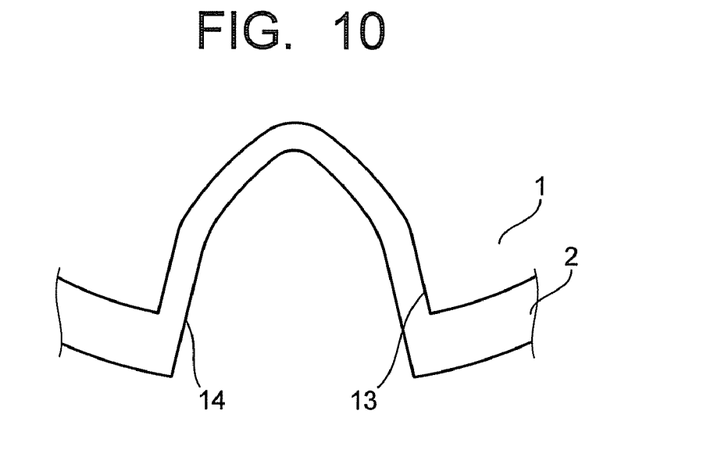
FIG. 10 is a plan view enlargedly showing a part of the laminated structure shown in FIG. 9.

FIGS. 9 and 10 relate to an embodiment modified from the first embodiment. As shown in FIGS. 9 and 10, a first notch 14 is formed at the periphery of the semiconductor substrate (semiconductor wafer) 1, and a second notch 15 is formed at the supporting substrate 2 shaped in wafer. The size of the second notch 15 is set smaller than the size of the first notch 14. Then, the semiconductor substrate 1 is laminated with the supporting substrate 2 so that the first notch 14 is matched with the second notch 15.

In this embodiment, since the size of the second notch 15 is smaller than the size of the first notch 14, the edges of the second notch are located inside from the edges of the first notch when the first notch is matched with the second notch. In this case, the positions of the notches 14 and 15 (concretely, the position of the second notch 15) can be detected using a mechanical position detecting means such as a pin. The positions of the notches 14 and 15 can be detected after the film-forming process is finished as described previously.

Therefore, the position detection of the semiconductor substrate 1 can be conducted effectively and efficiently.

In the embodiments, the semiconductor substrate 1 with the light receiving unit 3 within the active element region is laminated with the supporting substrate (light transmission protective member) 2, but the present invention is not limited to the embodiments. For example, when an FBAR filter or an MEMS which are made of piezoelectric body is formed on the first main surface of the semiconductor substrate, the FBAR filter or the MEMS is required to be covered with a protective member so that the FBAR filter or the MEMS can be disposed in the cavity formed between the semiconductor substrate and the protective member, according to the embodiments as described above. In this case, the semiconductor substrate 1 is cut out into the pieces with the supporting substrate 2. Each piece constitutes the semiconductor device 13 with the FBAR filter or the MEMS.

Figure 11:
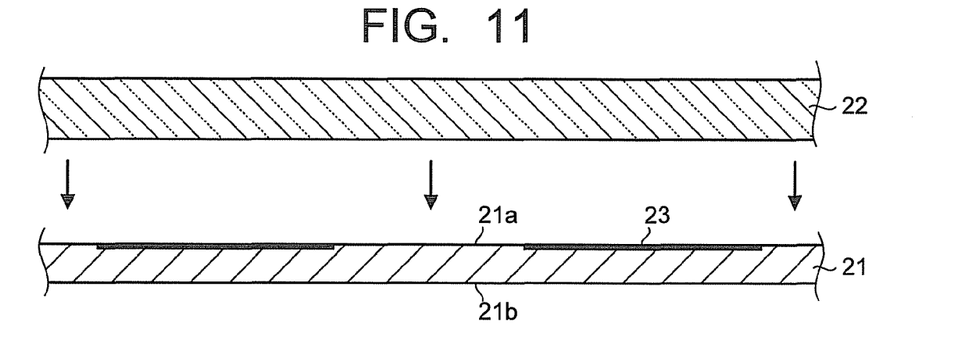
FIG. 11 is a cross sectional view showing the preparation of a semiconductor substrate and a supporting substrate in a method for manufacturing a semiconductor device according to a second embodiment.

Then, the manufacturing process of a semiconductor device according to a second embodiment will be described with reference to FIGS. 11 to 14. First of all, a semiconductor substrate 21 and a supporting substrate 22 are prepared as shown in FIG. 11. The semiconductor substrate 21 is supplied as a semiconductor wafer. The supporting substrate 22 is also supplied as a wafer-shaped substrate. The semiconductor substrate 1 is made of, e.g., silicon (Si). Then, an active element region with an element unit 23 containing transistors, resistances, condensers, wirings, electrodes and the like is defined on a first main surface 21a of the semiconductor substrate 21. The element unit 23 with the thus obtained semiconductor circuit made of the transistors and the like is appropriately selected and formed on a desired semiconductor device.

The supporting substrate 22 is made of a light transmission member such as glass substrate or a light non-transmission member such as semiconductor substrate. In this embodiment, the supporting member 22 is made of borosilicate glass, quartz glass or soda-lime glass, for example. The size of the supporting substrate 22 is set almost equal to or slightly larger than the size of the semiconductor substrate 21. The supporting substrate 22 is disposed above the first main surface 21a of the semiconductor substrate 21 on which the element unit 23 is formed.

Figure 12:
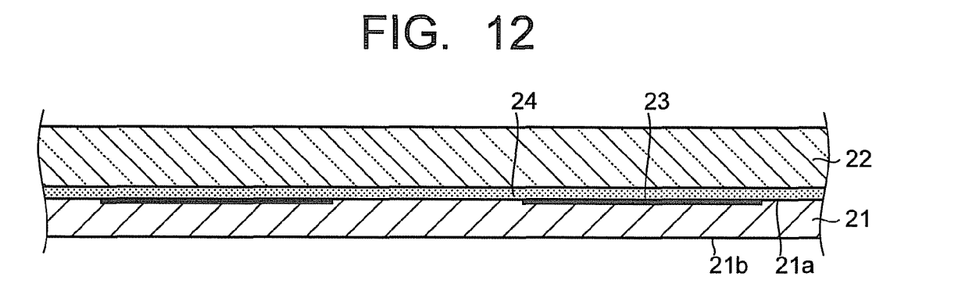
FIG. 12 is a cross sectional view showing the lamination of the semiconductor substrate and the supporting substrate in the manufacturing method according to the second embodiment.

Then, an adhesive layer 24 is coated at the periphery of the first main surface 21a of the semiconductor substrate 21 so that the semiconductor substrate 21 is laminated with the supporting substrate 22 via the adhesive layer 24, as shown in FIG. 12. The adhesive layer 24 may be made of epoxy resin, polyimide resin, acrylic resin, silicone resin or the like. In this case, since the supporting substrate 22 is peeled off from the semiconductor substrate 21 after the semiconductor substrate 21 is processed, it is desired to use, as the adhesive layer 24, the adhesive material easy to be peeled off by the irradiation of light. In this point of view, the supporting substrate 22 is preferably made of the light transmission member such as glass substrate.

The semiconductor substrate 21 is laminated with the supporting substrate 22 so that the first notch 14 is matched with the second notch 15 in the same manner as the first embodiment. The concrete shapes and functions of the first notch 14 and the second notch 15 may be set in the same manner as the concrete shapes and functions of the first notch 7 and the second notch 8, respectively.

Figure 13:
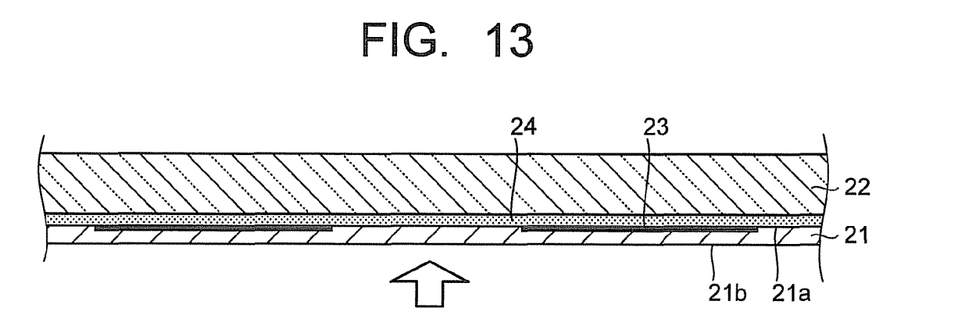
FIG. 13 is a cross sectional view showing the processing of the semiconductor substrate in the manufacturing method according to the second embodiment.

Then, the semiconductor substrate 21 is thinned as shown in FIG. 13 after the semiconductor substrate 21 is laminated with the supporting substrate 22. Namely, the second main surface 21b of the semiconductor substrate 21 opposite to the first main surface 21a thereof facing to the supporting substrate 22 is processed by means of mechanical grinding, chemical mechanical polishing (CMP), wet etching and/or dry etching to reduce the thickness of the semiconductor substrate 21 to a predetermined thickness. Therefore, the semiconductor substrate 21 can be thinned. The final thickness of the semiconductor substrate 21 can be set, depending on the intended semiconductor device.

Figure 14:
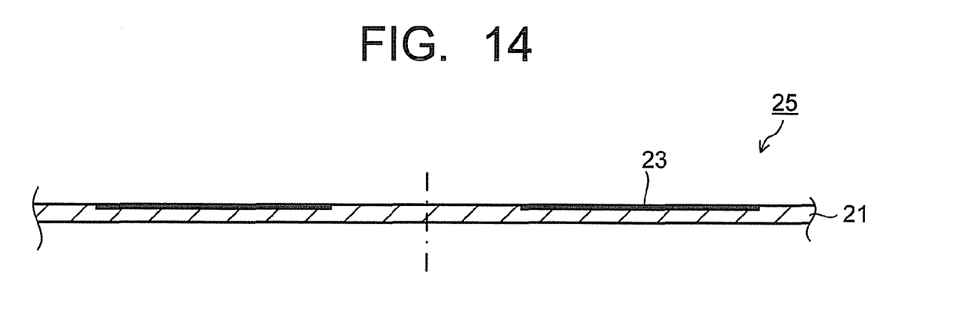
FIG. 14 is a cross sectional view showing the cutting process of the semiconductor substrate in the manufacturing method according to the second embodiment.

Then, after the subsequent steps (wafer process) are finished, the supporting substrate 22 is peeled off from the semiconductor substrate 21 as shown in FIG. 14. The peeling off process of the supporting substrate 22 is conducted on the sort of the adhesive layer 24. Since the element unit 23 is already formed on the semiconductor substrate 21, it is desired the peeling off process uses the light irradiation than the thermal treatment. Then, the semiconductor substrate 21 is cut out into pieces after the supporting substrate 22 is peeled off. Each piece constitutes the intended semiconductor device 25.

In the manufacturing process of the semiconductor device 25 according to the second embodiment, since the position of the first notch 14 of the semiconductor substrate 21 can be directly detected even though the semiconductor substrate 21 is laminated with the supporting substrate 22, the accuracy of the position detection of the semiconductor substrate 21 can be enhanced. Therefore, the manufacturing efficiency of the semiconductor device 25 can be enhanced and manufacturing cost of the semiconductor device 25 can be reduced.

Although the present invention was described in detail with reference to the above examples, this invention is not limited to the above disclosure and every kind of variation and modification may be made without departing from the scope of the present invention. For example, the present invention can be applied for various manufacturing method of a semiconductor device requiring thinning process and/or film forming process under the condition that the semiconductor substrate is laminated with the supporting substrate.

What is claimed is:

1. A method for manufacturing a semiconductor device, comprising:
    preparing a semiconductor substrate with a first notch;
    preparing a supporting substrate with a second notch;
    laminating said semiconductor substrate with said supporting substrate so that said first notch can be matched with said second notch; and
    processing a second main surface of said semiconductor substrate opposite to a first main surface thereof facing to said supporting substrate to reduce a thickness of said semiconductor substrate to a predetermined thickness;
    forming an active element region on said first main surface of said semiconductor substrate;
    forming a first wiring layer on said first main surface of said semiconductor substrate so as to be electrically connected with said active element region;
    forming a through hole at said semiconductor substrate so as to connect said first main surface and said second main surface; and
    forming a second wiring layer on said second main surface of said semiconductor substrate so as to be electrically connected with said first wiring layer via a conductive layer formed in said through hole.

2. The method as set forth in claim 1, wherein a size of said second notch is larger than a size of said first notch so that edges of said second notch are located outside from edges of said first notch when said first notch is matched with said second notch.

3. The method as set forth in claim 2, wherein said edges of said second notch are receded from said edges of said first notch by a distance of 0.3 mm or more.

4. The method as set forth in claim 1, wherein a size of said second notch is smaller than a size of said first notch so that edges of said second notch are located inside from edges of said first notch when said first notch is matched with said second notch.

5. The method as set forth in claim 1, wherein said active element region is disposed in a cavity formed between said semiconductor substrate and said supporting substrate.

6. The method as set forth in claim 1, further comprising:
   forming a protective layer so as to cover said second main surface of said semiconductor substrate;
   forming an opening at said protective layer so as to expose said second wiring layer; and
   forming an external connection terminal in said opening so as to be electrically connected with said second wiring layer so that said semiconductor device is constructed as a CSP (Chip Size Package).

7. The method as set forth in claim 1, further comprising cutting said semiconductor substrate out into pieces with said supporting substrate, wherein each piece constitutes said semiconductor device.

8. The method as set forth in claim 7, wherein said supporting substrate is made of a light transmission member.

9. The method as set forth in claim 1, further comprising:
   peeling off said supporting substrate from said semiconductor substrate; and
   cutting said semiconductor substrate out into pieces
   wherein each piece constitutes said semiconductor device.

10. The method as set forth in claim 9, wherein said supporting substrate is made of a light non-transmission member.

* * * * *